United States Patent
Griffin et al.

(10) Patent No.: US 8,110,416 B2
(45) Date of Patent: Feb. 7, 2012

(54) AC IMPEDANCE SPECTROSCOPY TESTING OF ELECTRICAL PARAMETRIC STRUCTURES

(75) Inventors: Alfred J Griffin, Dallas, TX (US); He Lin, Shanghai (CN)

(73) Assignee: Texas Instruments Incorporated, Dallas, TX (US)

( * ) Notice: Subject to any disclaimer, the term of this patent is extended or adjusted under 35 U.S.C. 154(b) by 77 days.

(21) Appl. No.: 12/328,287

(22) Filed: Dec. 4, 2008

(65) Prior Publication Data

US 2009/0162954 A1 Jun. 25, 2009

Related U.S. Application Data

(60) Provisional application No. 61/016,533, filed on Dec. 24, 2007.

(51) Int. Cl.
*H01L 21/66* (2006.01)
*G01R 31/00* (2006.01)

(52) U.S. Cl. ..................... 438/17; 324/750.01

(58) Field of Classification Search ............... 438/18; 324/750.01

See application file for complete search history.

(56) References Cited

U.S. PATENT DOCUMENTS 6,351,683 B1 * 2/2002 Johnson et al. ............... 700/121

OTHER PUBLICATIONS

Familiant, Y.L. "Ac Impedance Measurement Techniques" Conf. on Elec. Mach. and Drives, 2005 IEEE International published 2005 pp. 1850-1857.*
Loveday, David "Evaluation of Organic Coatings with Electrochemical Impedance Spectroscopy Part 1: Fundamentals of Electrochemical Impedance Spectroscopy" JCT CoatingsTech Aug. 2004 pp. 46-52.*
Loveday, David "Evaluation of Organic Coatings with Electrochemical Impedance Spectroscopy Part 2: Application of EIS to Coatings" JCT CoatingsTech Oct. 2004 pp. 88-93.*
Loveday, David "Evaluation of Organic Coatings with Electrochemical Impedance Spectroscopy Part 3: Evaluation of Organic Coatings with Electrochemical Impedance Spectroscopy" JCT CoatingsTech Feb. 2005 pp. 22-27.*
Silverman, D.C. "Primer on the AC Impedance Technique" Electrochemical Techniques for Corrosion Engineering 1986 pp. 73-79.*

* cited by examiner

*Primary Examiner* — N Drew Richards
*Assistant Examiner* — Grant Withers
(74) *Attorney, Agent, or Firm* — Warren L. Franz; Wade J. Brady, III; Frederick J. Telecky, Jr.

(57) ABSTRACT

Defects in components in ICs which may cause circuit failures during operation of the IC are often difficult to detect during and immediately after fabrication of the IC by DC test methods. A method of testing components to detect such defects using AC Impedance Spectroscopy is disclosed. Data may be analyzed using Nyquist plots and Bode plots. Nyquist plots of typical defect types are disclosed. Components may include MOS transistor gate structures, contacts, vias and metal interconnect lines. Components tested may be contained in integrated circuits or in test circuits. Integrated circuits containing components tested by AC Impedance Spectroscopy may be partially fabricated or deprocessed after fabrication.

18 Claims, 13 Drawing Sheets

US 8,110,416 B2

AC IMPEDANCE SPECTROSCOPY TESTING OF ELECTRICAL PARAMETRIC STRUCTURES

FIELD OF THE INVENTION

This invention relates to the field of integrated circuits. More particularly, this invention relates to methods to electrically test components of integrated circuits.

BACKGROUND OF THE INVENTION

It is well known that components in integrated circuits (ICs), such as NMOS and PMOS transistors and interconnect structures, including contacts and vias, are shrinking with each new technology node, as articulated by Moore's Law. As structure sizes become smaller, it is more difficult to identify components with performance and reliability defects. In particular, a commonly used DC method of testing gates, contacts, vias, capacitors and interconnect isolation structures does not reliably identify all those structures with voids, contamination, or constricted regions that may cause failures during IC operation.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

This invention discloses a method of testing components in integrated circuits by AC Impedance Spectroscopy. Components may include MOS transistor gate structures, contacts, vias and metal interconnect lines. Components tested may be contained in integrated circuits or in test circuits. Integrated circuits containing components tested by AC Impedance Spectroscopy may be partially fabricated or deprocessed after fabrication.

DETAILED DESCRIPTION

Figure 1:
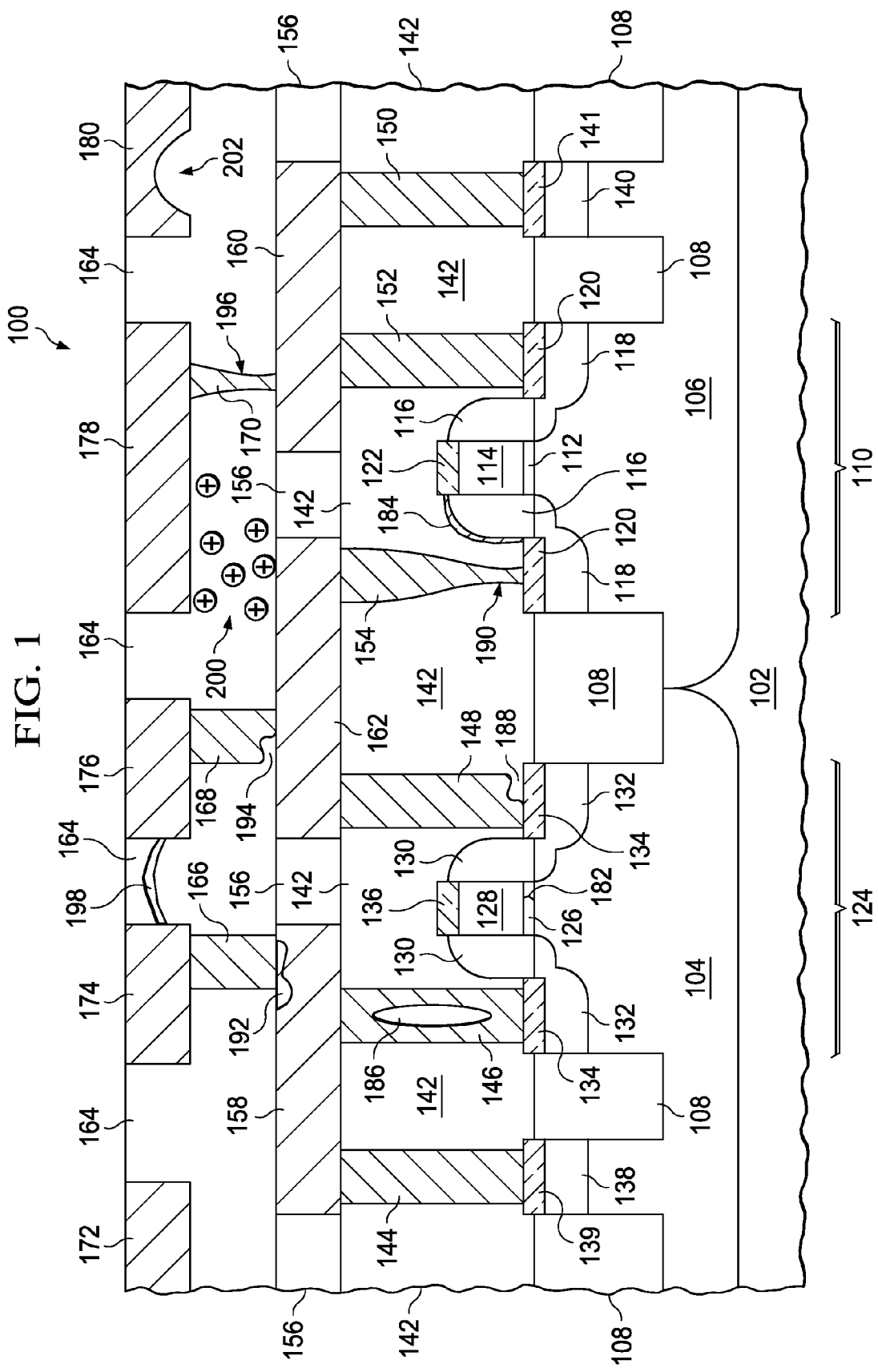
FIG. 1 is a cross-sectional view of an IC with NMOS and PMOS transistors, contacts, metal interconnect lines, vias and interconnect dielectrics.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 is a cross-sectional view of an IC with NMOS and PMOS transistors, contacts, metal interconnect lines, vias and interconnect dielectrics. IC (100) includes a substrate (102), commonly p-type silicon, in which is formed an n-type region (104) known as an n-well, typically by ion implantation of phosphorus, and a p-type region (106) known as a p-well, typically formed by ion implantation of boron. Field oxide regions (108) are formed in the IC (100), typically of silicon dioxide and typically formed by Local Oxidation of Silicon (LOCOS) or Shallow Trench Isolation (STI), to separate components in the IC (100). An NMOS transistor (110) is formed in the p-well (106); NMOS transistor (110) includes a gate dielectric (112) on a top surface of the p-well (106), an NMOS gate (114) on a top surface of the gate dielectric (112), NMOS gate sidewall spacers (116) abutting the NMOS gate (114), n-type source and drain regions (118) formed in the p-well (106) adjacent to the NMOS gate (114), optional source/drain metal silicide regions (120) formed at a top surface of the source and drain regions (118), and an optional gate metal silicide region (122) formed at a top surface of the NMOS gate (114). Similarly, a PMOS transistor (124) is formed in the n-well (104); PMOS transistor (124) includes a gate dielectric (126) on a top surface of the n-well (104), a PMOS gate (128) on a top surface of the gate dielectric (126), PMOS gate sidewall spacers (130) abutting the PMOS gate (128), p-type source and drain regions (132) formed in the n-well (104) adjacent to the PMOS gate (128), optional source/drain metal silicide regions (134) formed at a top surface of the source and drain regions (132), and an optional gate metal silicide region (136) formed at a top surface of the PMOS gate (128). Gate dielectrics in NMOS and PMOS transistors occasionally have defects such that the gate structures function within specified limits during fabrication and testing, but cause failures of ICs after the circuits have been operation for some time. Practitioners of IC fabrication will recognize the benefit of identifying defective gate structures in a cost effective manner as an aid to solving a cause or causes of the defects, and to enable appropriate disposition of the affected ICs in a timely manner. An n-type diffused contact region (138) is formed, typically simultaneously with the n-type source and drain regions, in the n-well (104), and a p-type diffused contact region (140) is formed, typically simultaneously with the p-type source and drain regions, in the p-well (106). An optional layer of metal silicide (139) is formed on a top surface of the n-type diffused contact region (138), and an optional layer of metal silicide (141) is formed on a top surface of the p-type diffused contact region (140), both typically simultaneously with the metal silicide regions over the source and drain regions. A pre-metal dielectric layer stack (PMD) (142), typically including a thin layer of silicon nitride and a thicker layer of silicon dioxide, is formed over the NMOS and PMOS transistors (110, 124), the field oxide regions (108) and the well diffused contact regions (138, 140). Contacts are formed in the PMD (142) to the components in the IC (100), including an n-well contact (144), PMOS drain contact (146), PMOS source contact (148), p-well contact (150), NMOS source contact (152) and NMOS drain contact (154). Contacts occasionally have defects such that the contacts function within specified limits during fabrication and testing, but cause failures of ICs after the circuits have been operation for some time. Practitioners of IC fabrication will recognize the benefit of identifying defective contacts in a cost effective manner as an aid to solving a cause or causes of the defects, and to enable appropriate disposition of the affected ICs in a timely manner. A first intra-level dielectric layer (156), typically including a low-k dielectric material layer, is formed over the PMD (142) and contacts (144-154). A first set of metal interconnect lines are formed in first intra-level dielectric layer (156), including a line (158) connecting the PMOS drain to the n-well, a line (160) connecting the NMOS source to the p-well, and a line (162) connecting the PMOS source to the NMOS drain. Metal interconnect lines occasionally have defects such that the interconnects function within specified limits during fabrication and testing, but cause failures of ICs after the circuits have been operation for some time. Practitioners of IC fabrication will recognize the benefit of identifying defective metal interconnect lines in a cost effective manner as an aid to solving a cause or causes of the defects, and to enable appropriate disposition of the affected ICs in a timely manner. A first inter-level dielectric layer (164), typically including a low-k dielectric material layer, is formed over the first intra-level dielectric layer and the first set of metal interconnect lines (158-162). A first set of vias (166-170) and a second set of metal interconnect lines (172-180) are formed in first inter-level dielectric layer (164). Note that metal lines (162) and (178) form a capacitor, which is a common component in integrated circuits. Vias occasionally have defects such that the vias function within specified limits during fabrication and testing, but cause failures of ICs after the circuits have been operation for some time. Practitioners of IC fabrication will recognize the benefit of identifying defective vias in a cost effective manner as an aid to solving a cause or causes of the defects, and to enable appropriate disposition of the affected ICs in a timely manner.

A first example of a gate structure defect is a conductive spot (182) in the gate dielectric. A second example of a gate structure defect is a metal silicide filament (184) on the gate sidewall spacer (116).

A first example of a contact defect is a void (186) in the contact metal. A second example of a contact defect is a region of contamination (188) between a contact and the underlying active region. A third example of a contact defect is a constriction (190) in a contact.

A first example of a via defect is a void (192) in the metal (158) under a via. A second example of a via defect is a region of contamination (194) between a via and underlying metal (162). A third example of a via defect is a constriction (196) in a via.

A first example of a metal interconnect defect is a metal filament (198) between two metal lines (174, 176). A second example of a metal interconnect defect is a region of mobile ions (200) in the dielectric material (164) between two metal lines (162, 178). A third example of a metal interconnect defect is a constriction (202) in a metal line (180).

AC Impedance Spectroscopy as embodied in the instant invention measures a complex impedance of a component as a function of frequency, from less than 10 Hz to over 100 MHz, and as a function of the magnitude of applied signal, either a potential or a current. Data from AC Impedance Spectroscopy may be analyzed by plotting the real parts of the complex impedance values on the x-axis (horizontal axis) of an x-y chart and the imaginary parts on the y-axis (vertical axis). Such a chart is known as a Nyquist plot. Spectra of different applied amplitude may be plotted to the same chart. Analysis of AC Impedance Spectroscopy data from measurements of defects in integrated circuits allows identification of features of the defects that cannot be deduced from DC measurement data.

Figure 2A:
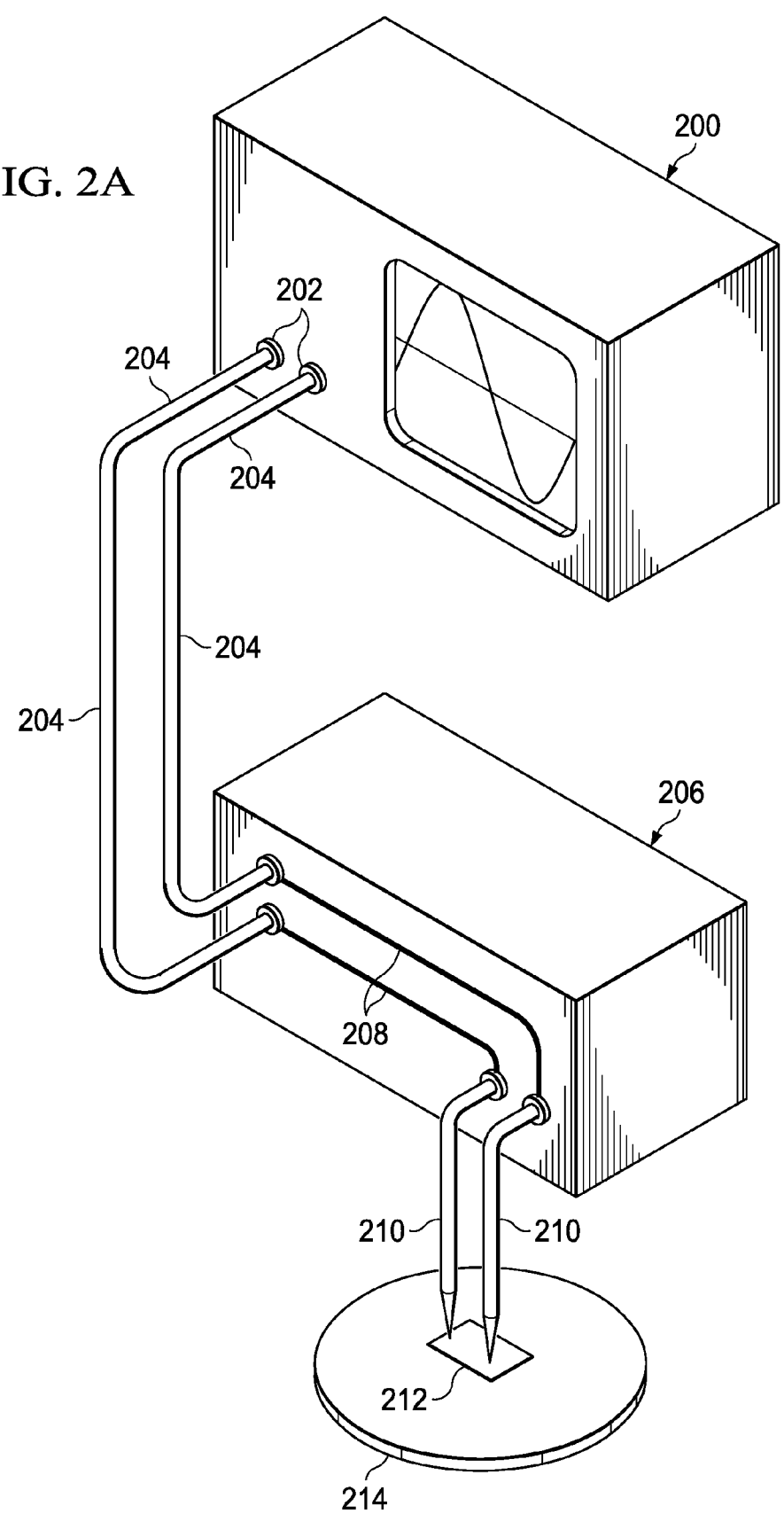
FIG. 2A is an illustration of an AC Impedance Spectroscopy measurement.

FIG. 2A is an illustration of an AC Impedance Spectroscopy measurement. An AC Impedance Analyzer (200) is an electronic measurement tool that outputs a sinusoidal voltage signal with user-selected frequency and amplitude, and measures a current in the output signal. Moreover, the AC Impedance Analyzer measures an amplitude of a current component that is in phase with the output signal and an amplitude of a current component that is out of phase with the output signal. Examples of AC Impedance Analyzers are an Agilent 4294A, an Agilent 4192A, and an Agilent 4395A. The sinusoidal voltage signal from the AC Impedance Analyzer (200) is output on ports (202), which are connected by coaxial cables (204) to probing equipment (206). Probing equipment routes signals from various pieces of measurement equipment to probes which contact the device being tested. In this example, probing equipment (206) has internal electrical connections (208) which route the sinusoidal voltage signal from the cables (204) to probes (210). Probes (210) are in contact with a device (212) being tested, which is contained in an IC substrate (214), depicted in this example as a semiconductor wafer. The sinusoidal voltage signal from the AC Impedance Analyzer (200) induces an electrical current in the device being tested (212), sometimes known as a "Device Under Test" or DUT. The electrical current flows through the probes (210), the connections (208) in the probing equipment (206) and the cables (204), and is measured by the AC Impedance Analyzer.

Figure 2B:
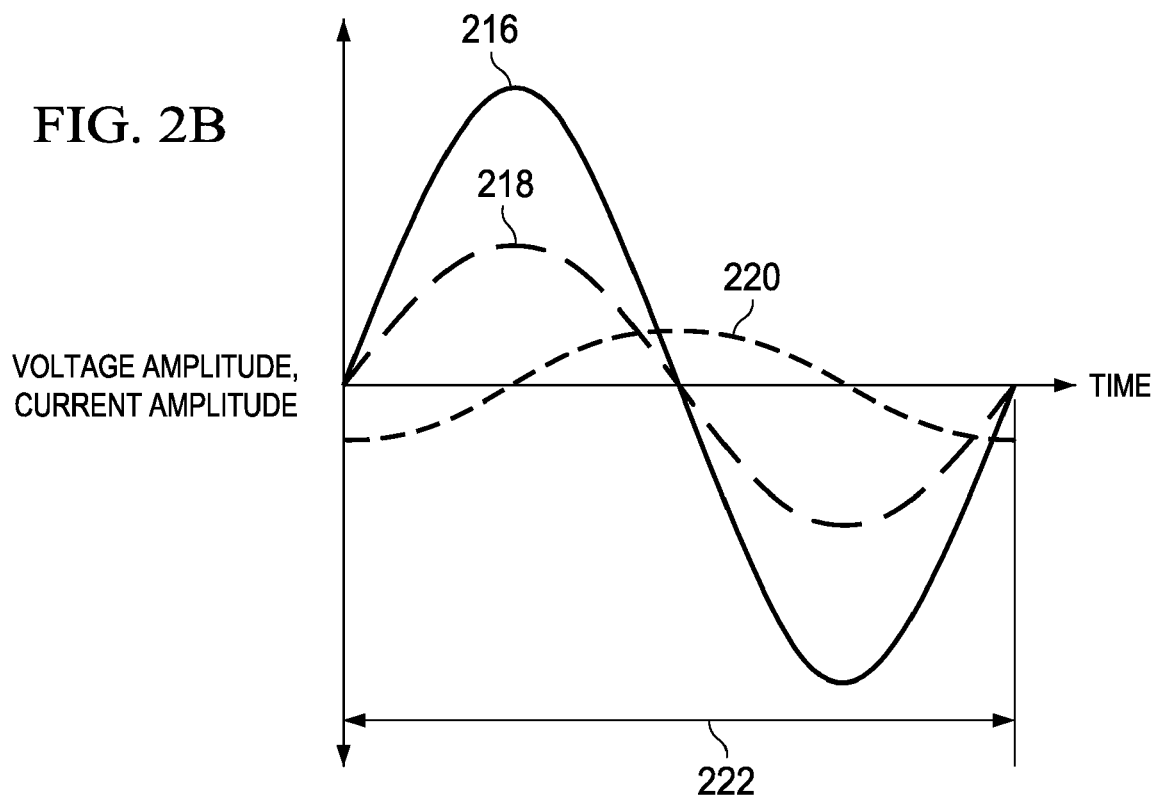
FIG. 2B is a chart depicting a sinusoidal voltage signal supplied by the AC Impedance analyzer, and in-phase and out-of-phase current components from a device being tested, as functions of time.

FIG. 2B is a chart depicting a sinusoidal voltage signal supplied by the AC Impedance analyzer, and in-phase and out-of-phase current components from a device being tested, as functions of time. A sinusoidal voltage signal (216) may be represented by the expression:

$$V_{signal}(t) = V_{amplitude} \cdot \sin(2\pi ft) \qquad \text{Equation 1}$$

where:

$V_{signal}(t)$ is the sinusoidal voltage signal;

$V_{amplitude}$ is the maximum voltage of the sinusoidal voltage signal; and f is the frequency of the signal.

An in-phase current component (218) has zero amplitude at the same points in time as the sinusoidal voltage signal (216), and reaches positive and negative maximum amplitude at the same points in time as the sinusoidal voltage signal (216). The in-phase current component (218), which has a sinusoidal time dependence, may be represented by the expression:

$$I_{in\text{-}phase}(t)=I_{in\text{-}phase\_max}\cdot\sin(2\pi ft) \quad \text{Equation 2}$$

where:

$I_{in\text{-}phase}(t)$ is the in-phase current component;

$I_{in\text{-}phase\_max}$ is the maximum voltage of the in-phase current component; and f is the frequency of the signal.

An out-of-phase current component (220) has zero amplitude at the points in time when the sinusoidal voltage signal (216) has positive and negative peaks, and reaches positive and negative maximum amplitude at the points in time when the sinusoidal voltage signal (216) has zero amplitude. This relationship is commonly known as "90 degrees out of phase." The out-of-phase current component (220), which also has a sinusoidal time dependence, may be represented by the expression:

$$I_{out\text{-}of\text{-}phase}(t)=I_{out\text{-}of\text{-}phase\_max}\cdot\cos(2\pi ft) \quad \text{Equation 3}$$

where:

$I_{out\text{-}of\text{-}phase}(t)$ is the out-of-phase current component;

$I_{out\text{-}of\text{-}phase\_max}$ is the maximum voltage of the out-of-phase current component; and f is the frequency of the signal.

A time span (222) of one cycle of the sinusoidal voltage signal (216) is related to the frequency of the sinusoidal voltage signal (216) by the expression:

$$f=1/t_{cycle} \quad \text{Equation 4}$$

where:

f is the frequency of the signal; and $t_{cycle}$ is the time span of one cycle of the sinusoidal voltage signal.

Sinusoidal current components are often represented by complex numbers, which have the form a+bj, where a is a real number, and is called the real component of the complex number, b is a real number, and is called the imaginary component of the complex number, and j is a pure imaginary number equal to $\sqrt{-1}$. The current measured in an AC Impedance Spectroscopy test may be represented as a complex number:

$$I_{AC\text{-}IS}(t)=I_{in\text{-}phase}(t)+j\cdot I_{out\text{-}of\text{-}phase}(t) \quad \text{Equation 4}$$

$I_{in\text{-}phase}$ is referred to as the real component of the measured current and $I_{out\text{-}of\text{-}phase}$ is referred to as the imaginary component of the measured current $I_{AC\text{-}IS}$.

Figure 3:
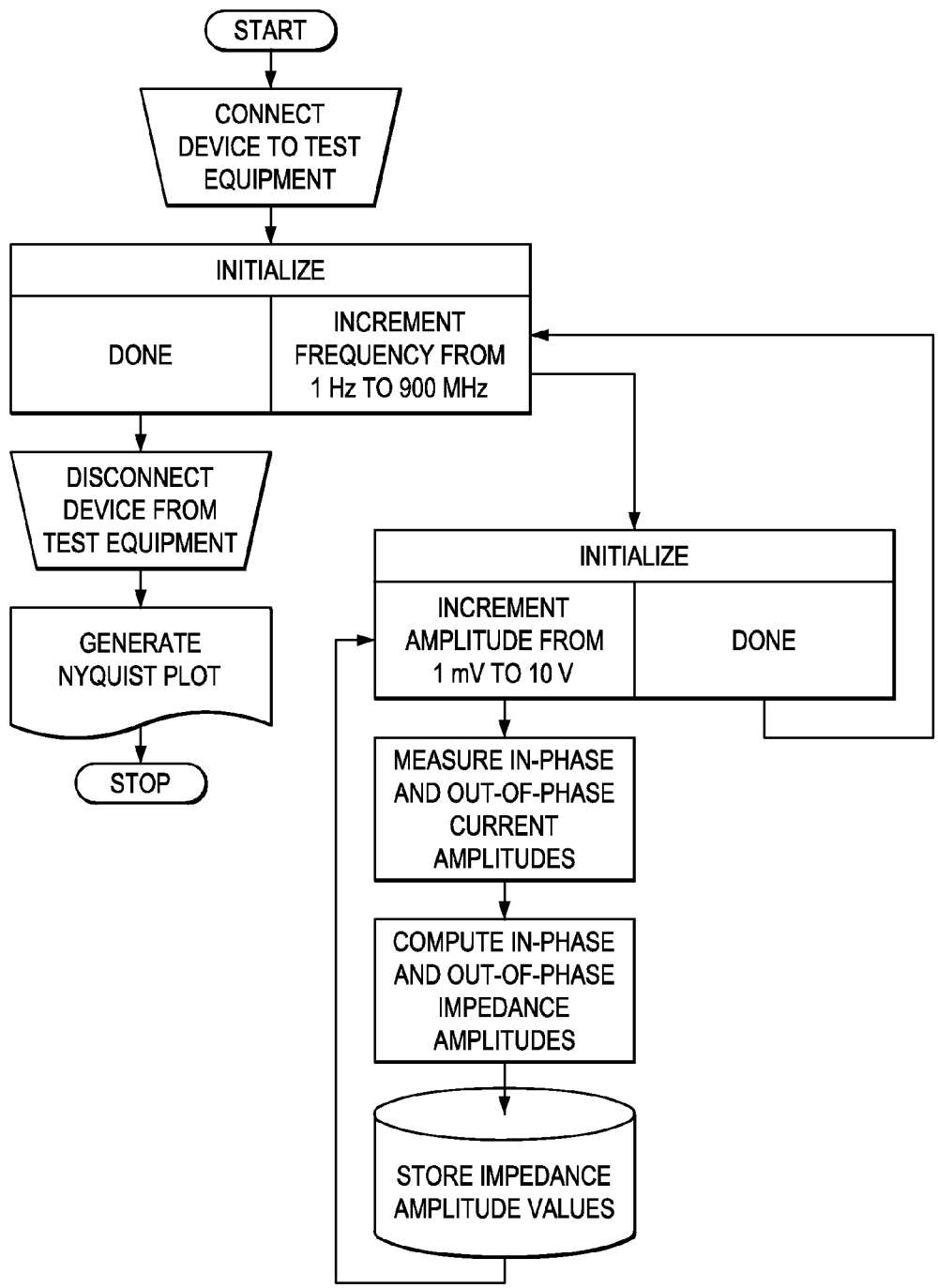
FIG. 3 is a flowchart of an AC Impedance Spectroscopy measurement.

FIG. 3 is a flowchart of an AC Impedance Spectroscopy measurement. The steps of the measurement are:

Connect Device to Test Equipment: connect probing equipment to an AC Impedance Analyzer by appropriate coaxial cables, configure the probing equipment to connect the cables to probes of the probing equipment, and bring the probes into contact with a device to be tested.

Increment Frequency from 1 Hz to 900 MHz: this step is an iterative step in which the frequency of the sinusoidal voltage signal is first set to 1 Hz for an initial reading, and is incremented for subsequent readings to a maximum value of 900 MHz. The following steps are executed for each increment of the frequency:

Increment Amplitude from 1 mV to 10 V: this step is also an iterative step in which the voltage amplitude of the sinusoidal voltage signal is first set to 1 mV for an initial reading, and is incremented for subsequent readings to a maximum value of 10 V. The following steps are executed for each increment of the frequency:

Measure in-phase and out-of-phase current amplitudes: the AC Impedance Analyzer performs this step.

Compute in-phase and out-of-phase impedance amplitudes: This step may be performed by the AC Impedance Analyzer or by separate computing equipment. The in-phase impedance amplitudes is computed from the expression:

$$Z_{in\text{-}phase}=V_{amplitude}/I_{in\text{-}phase\_max} \quad \text{Equation 5}$$

Similarly, the out-of-phase impedance amplitudes is computed from the expression:

$$Z_{out\text{-}of\text{-}phase}=V_{amplitude}/I_{out\text{-}of\text{-}phase\_max} \quad \text{Equation 6}$$

Store impedance amplitude values: the values of $Z_{in\text{-}phase}$ and $Z_{out\text{-}of\text{-}phase}$ are stored for later retrieval and use in data analysis.

Disconnect Device from Test Equipment: after the readings have been taken and impedance values have been stored for all increments of frequency and voltage amplitude, the device being tested may be disconnected from the probing equipment.

Generate Nyquist plot: AC Impedance Spectroscopy data is typically analyzed using a chart called a Nyquist plot, which is an x-y graph where the real impedance components are plotted on the x-axis and the imaginary impedance components are plotted on the y-axis. Nyquist plot examples will be discussed in reference to FIGS. 11A through 11D.

Figure 4:
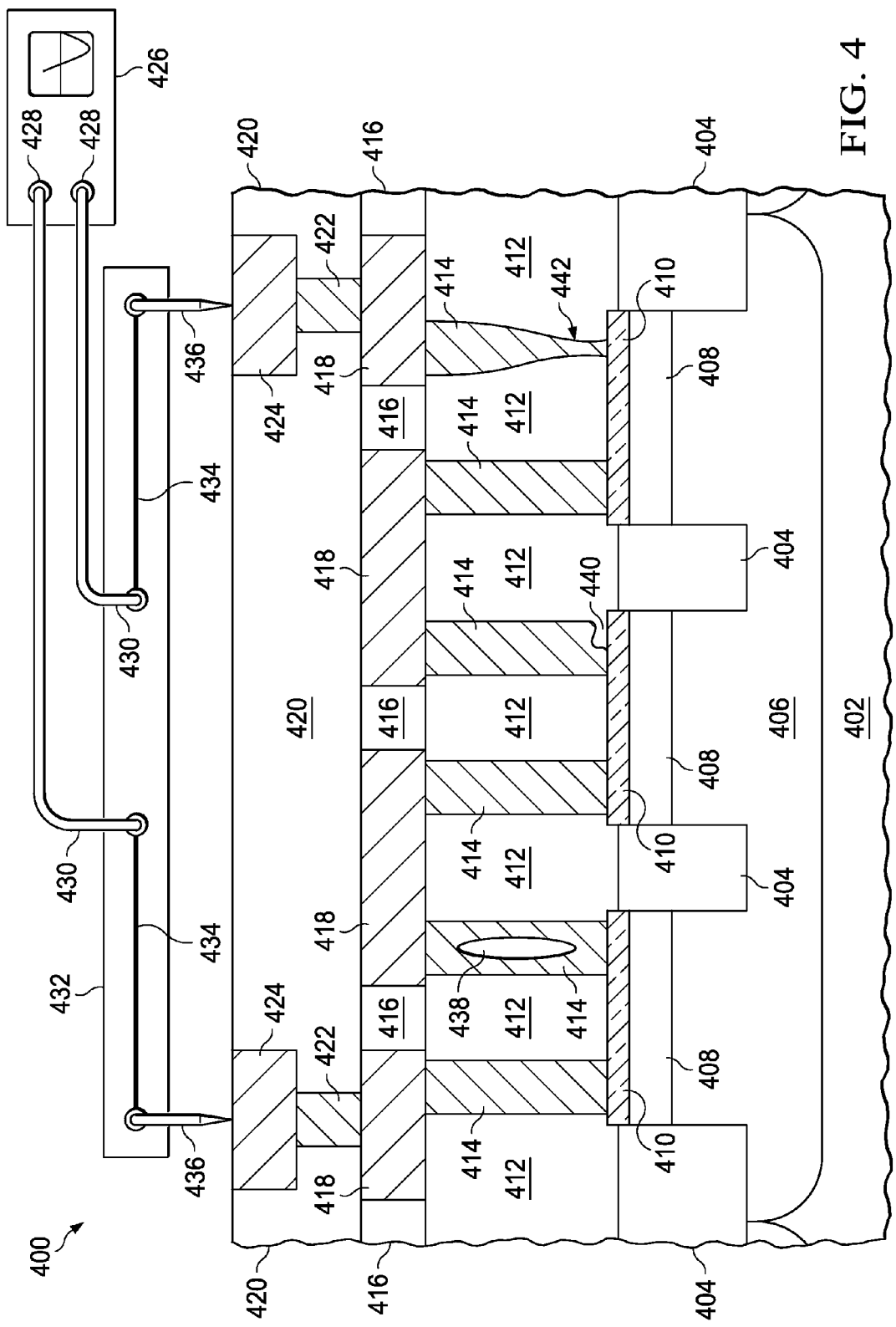
FIG. 4 depicts an IC, shown in cross-section, with a contact chain test circuit, in an AC Impedance Spectroscopy measurement.

FIG. 4 depicts an IC, shown in cross-section, with a contact continuity chain test circuit, in an AC Impedance Spectroscopy measurement. IC (400) includes a substrate (402), typically p-type silicon. Regions of field oxide (404), typically silicon dioxide formed by LOCOS or STI, are formed in the substrate (402) and extend to a top surface of the substrate (402). An n-well (406) is formed, typically by ion implantation of phosphorus, in the substrate (402) and extends to the top surface of the substrate (402). Active areas (408) are ion implanted with more phosphorus, with doses ranging from $10^{14}$ to $10^{16}$ cm$^{-2}$. An optional layer of silicide (410) is formed on a top surface of each active area (408). A pre-metal dielectric layer stack (PMD) (412), typically including a thin layer of silicon nitride and a thicker layer of silicon dioxide, is formed over the field oxide regions (404) and the active areas (408). Contacts (414) are formed in the PMD (412) and connect to the active areas (408). A first intra-level dielectric layer (416), typically including a low-k dielectric material layer, is formed over the PMD (412) and contacts (414). A first set of metal interconnect lines (418) are formed in first intra-level dielectric layer (416). The active areas (408), contacts (414) and first set of metal interconnect lines (418) are configured to form a contact continuity chain test circuit in which an electrical current passed through the contact continuity chain test circuit will pass through each contact. The contact continuity chain test circuit is configured to minimize the effect of a defect in the active areas (408) or in the first set of metal interconnect lines (418) on an Impedance Spectroscopy measurement. A first inter-level dielectric layer (420), typically including a low-k dielectric material layer, is formed over the first intra-level dielectric layer (416) and the first set of metal interconnect lines (418)). A first set of vias (422) and a second set of metal interconnect lines (424) are formed in first inter-level dielectric layer (420). An AC Impedance Analyzer (426) has output ports (428) that are connected by cables (430) to probing equipment (432). Internal connections (434) contained in the probing equipment (432) connect the cables (430) to probes (436), which are contacting test pads in the second set of metal interconnect lines (424), thereby enabling an AC Impedance Spectroscopy measurement. Contact defects such as a void (438), a region of contamination (440) between a contact and the underlying active region or a constriction (442) may be detected by the AC Impedance Spectroscopy measurement, as discussed in reference to FIGS. 11A through 11D, below.

Figure 5:
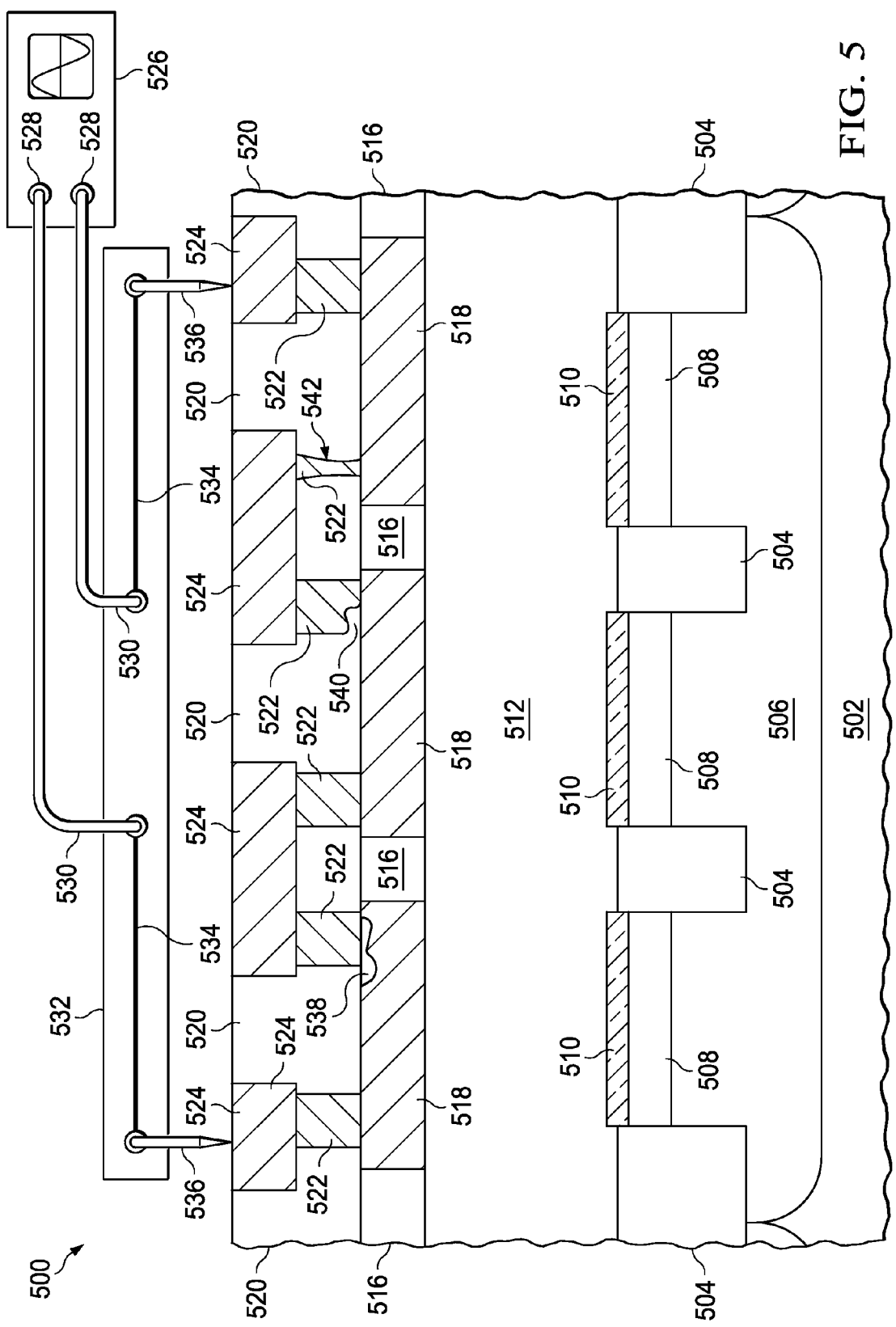
FIG. 5 depicts an IC, shown in cross-section, with a via chain test circuit, in an AC Impedance Spectroscopy measurement.

FIG. 5 depicts an IC, shown in cross-section, with a via continuity chain test circuit, in an AC Impedance Spectroscopy measurement. IC (500) includes a substrate (502), typically p-type silicon. Regions of field oxide (504), typically silicon dioxide formed by LOCOS or STI, are formed in the substrate (502) and extend to a top surface of the substrate (502). An n-well (506) is formed, typically by ion implantation of phosphorus, in the substrate (502) and extends to the top surface of the substrate (502). Active areas (508) are ion implanted with more phosphorus, with doses ranging from $10^{14}$ to $10^{16}$ cm$^{-2}$. An optional layer of silicide (510) is formed on a top surface of each active area (508). A pre-metal dielectric layer stack (PMD) (512), typically including a thin layer of silicon nitride and a thicker layer of silicon dioxide, is formed over the field oxide regions (504) and the active areas (508). A first intra-level dielectric layer (516), typically including a low-k dielectric material layer, is formed over the PMD (512). A first set of metal interconnect lines (518) are formed in first intra-level dielectric layer (516). A first inter-level dielectric layer (520), typically including a low-k dielectric material layer, is formed over the first intra-level dielectric layer (516) and the first set of metal interconnect lines (518). A first set of vias (522) and a second set of metal interconnect lines (524) are formed in first inter-level dielectric layer (520). The first set of metal interconnect lines (518), the first set of vias (522), and the second set of metal interconnect lines (524) are configured to form a via continuity chain test circuit in which an electrical current passed through the via continuity chain test circuit will pass through each via. The via continuity chain test circuit is configured to minimize the effect of a defect in the first set of metal interconnect lines (518) or in the second set of metal interconnect lines (524) on an Impedance Spectroscopy measurement. An AC Impedance Analyzer (526) has output ports (528) that are connected by cables (530) to probing equipment (532). Internal connections (534) contained in the probing equipment (532) connect the cables (530) to probes (536), which are contacting test pads in the second set of metal interconnect lines (524), thereby enabling an AC Impedance Spectroscopy measurement. Via defects such as a void (538) in the underlying metal interconnect line, a region of contamination (540) between a via and the underlying metal interconnect line, or a constriction (542) may be detected by the AC Impedance Spectroscopy measurement, as discussed in reference to FIGS. 11A through 11D, below.

Figure 6:
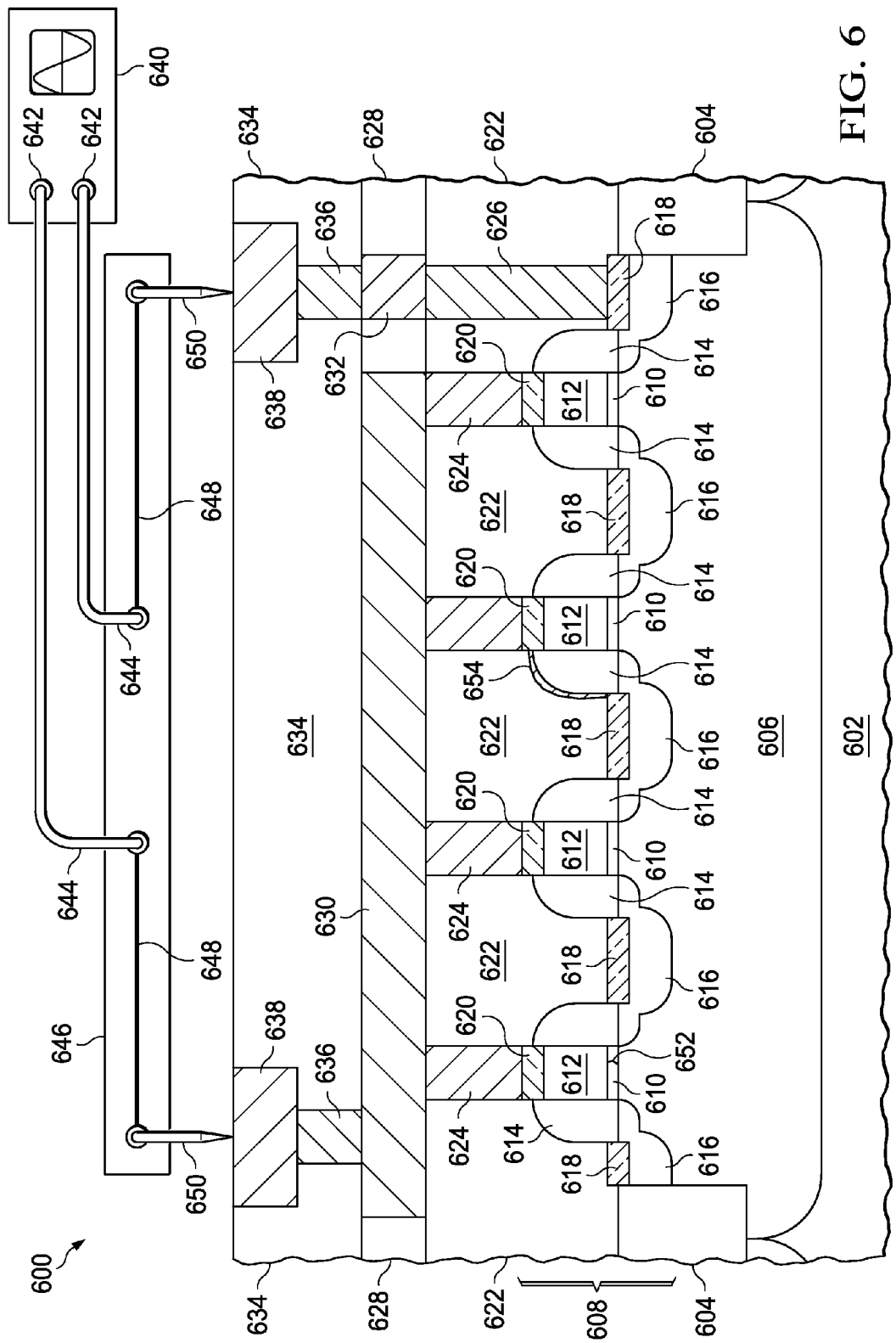
FIG. 6 depicts an IC, shown in cross-section, with an MOS gate dielectric integrity test circuit, in an AC Impedance Spectroscopy measurement.

FIG. 6 depicts an IC, shown in cross-section, with an MOS gate dielectric integrity test circuit, in an AC Impedance Spectroscopy measurement. IC (600) includes a substrate (602), typically p-type silicon. Regions of field oxide (604), typically silicon dioxide formed by LOCOS or STI, are formed in the substrate (602) and extend to a top surface of the substrate (602). A p-well (606) is formed, typically by ion implantation of boron, in the substrate (602) and extends to the top surface of the substrate (602). MOS gate structures (608) are formed in the p-well (606), each MOS gate structure includes a gate dielectric (610) on a top surface of the p-well (606), an MOS gate (612) on a top surface of the gate dielectric (610), MOS gate sidewall spacers (614) abutting the MOS gate (612), n-type diffused regions (616) formed in the p-well (606) adjacent to the MOS gate (612), optional source/drain metal silicide regions (618) formed at a top surface of the diffused regions (616), and an optional gate metal silicide region (620) formed at a top surface of the MOS gate (612). A pre-metal dielectric layer stack (PMD) (622), typically including a thin layer of silicon nitride and a thicker layer of silicon dioxide, is formed over the field oxide regions (604) and the MOS gate structures (608). Gate contacts (624) and a substrate contact (626) are formed, in the PMD (622) to the MOS gates (612) and the n-type diffused regions (616). A first intra-level dielectric layer (628), typically including a low-k dielectric material layer, is formed over the PMD (622) and contacts (624, 626). A first set of metal interconnect lines, including a gate bus (630) and a substrate bus (632) are formed in first intra-level dielectric layer (628). The p-well (606), gate structures (608), contacts (624, 626), gate bus (630) and substrate bus (632) are configured to form an MOS gate dielectric integrity test circuit in which a voltage applied across the MOS gate dielectric integrity test circuit will apply the voltage across each gate dielectric element in the MOS gate dielectric integrity test circuit. A potential applied to the substrate contact (626) will be applied to the p-well (606) due to a finite impedance of a junction between the n-type diffused regions (616) and the p-well (606). The MOS gate dielectric integrity test circuit is configured to minimize the effect of a defect in the first set of metal interconnect lines (618) or in the (624, 626) on an Impedance Spectroscopy measurement. A first inter-level dielectric layer (634), typically including a low-k dielectric material layer, is formed over the first intra-level dielectric layer (628) and the first set of metal interconnect lines. A first set of vias (636) and a second set of metal interconnect lines (638) are formed in first inter-level dielectric layer (634). An AC Impedance Analyzer (640) has output ports (642) that are connected by cables (644) to probing equipment (646). Internal connections (648) contained in the probing equipment (646) connect the cables (644) to probes (650), which are contacting test pads in the second set of metal interconnect lines (638), thereby enabling an AC Impedance Spectroscopy measurement. Gate defects such as a conductive spot (652) in the gate dielectric or a metal silicide filament (654) on the gate sidewall spacer (614) may be detected by the AC Impedance Spectroscopy measurement, as discussed in reference to FIGS. 11A through 11D, below.

Figure 7:
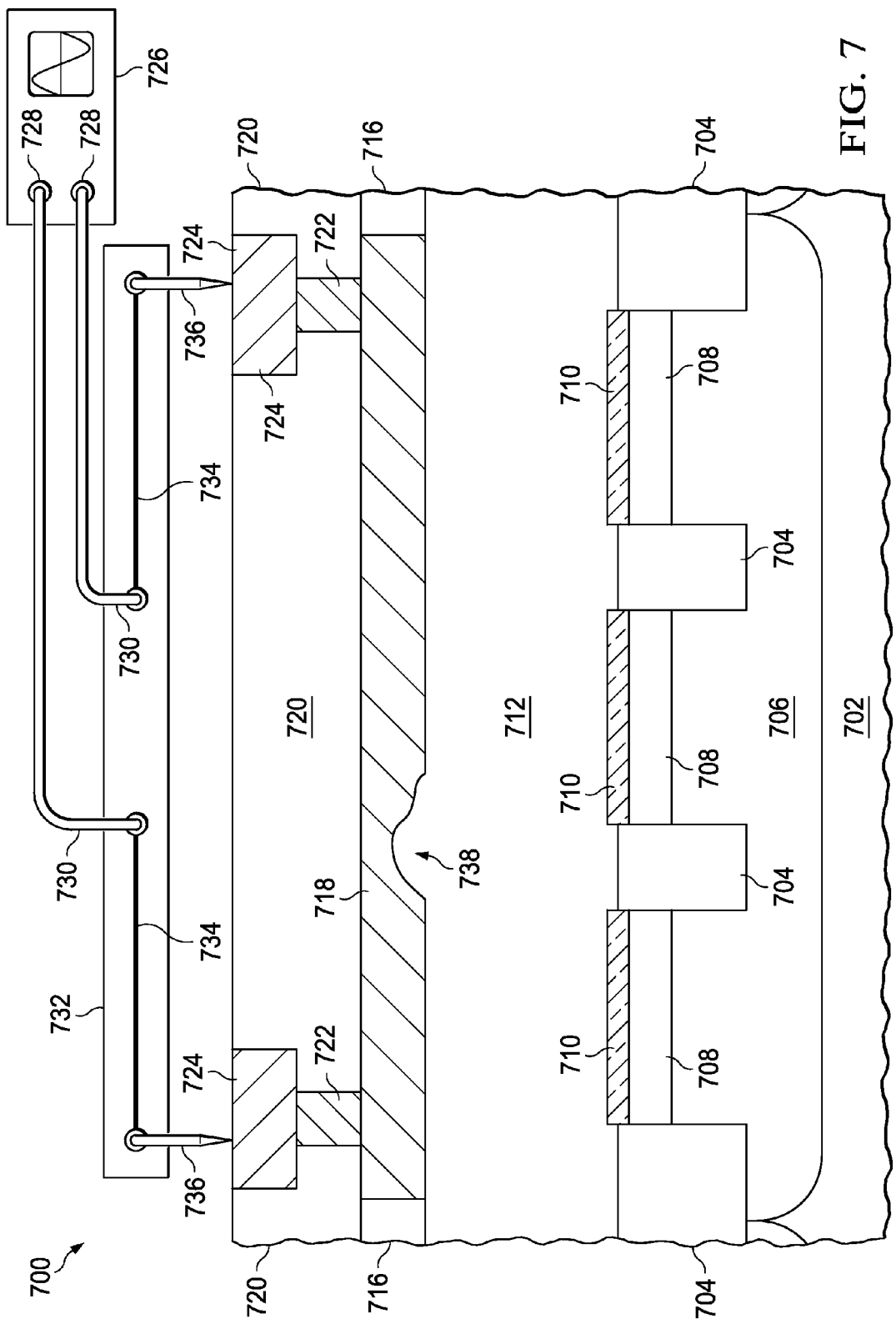
FIG. 7 depicts an IC, shown in cross-section, with a metal line continuity test circuit, in an AC Impedance Spectroscopy measurement.

FIG. 7 depicts an IC, shown in cross-section, with a metal line continuity test circuit, in an AC Impedance Spectroscopy measurement. IC (700) includes a substrate (702), typically p-type silicon. Regions of field oxide (704), typically silicon dioxide formed by LOCOS or STI, are formed in the substrate (702) and extend to a top surface of the substrate (702). An n-well (706) is formed, typically by ion implantation of phosphorus, in the substrate (702) and extends to the top surface of the substrate (702). Active areas (708) are ion implanted with more phosphorus, with doses ranging from $10^{14}$ to $10^{16}$ cm$^{-2}$. An optional layer of silicide (710) is formed on a top surface of each active area (708). A pre-metal dielectric layer stack (PMD) (712), typically including a thin layer of silicon nitride and a thicker layer of silicon dioxide, is formed over the field oxide regions (704) and the active areas (708). A first intra-level dielectric layer (716), typically including a low-k dielectric material layer, is formed over the PMD (712). A first set of metal interconnect lines, including a continuity test line (718) are formed in first intra-level dielectric layer (716). A first inter-level dielectric layer (720), typically including a low-k dielectric material layer, is formed over the first intra-level dielectric layer (716) and the first set of metal interconnect lines. A first set of vias (722) and a second set of metal interconnect lines (724) are formed in first inter-level dielectric layer (720). The first set of metal interconnect lines (718), the first set of vias (722), and the second set of metal interconnect lines (724) are configured to form a metal line continuity test circuit in which an electrical current passed through the metal line continuity test circuit will pass through the continuity test line (718). The metal line continuity test circuit is configured to minimize the effect of a defect in the first set of vias (722) or in the second set of metal interconnect lines (724) on an Impedance Spectroscopy measurement. This is commonly accomplished by making the element of the first set of metal interconnect lines in the metal line continuity test circuit much longer than any other elements. An AC Impedance Analyzer (726) has output ports (728) that are connected by cables (730) to probing equipment (732). Internal connections (734) contained in the probing equipment (732) connect the cables (730) to probes (736), which are contacting test pads in the second set of metal interconnect lines (724), thereby enabling an AC Impedance Spectroscopy measurement. Metal capacitor defects such as a constriction (738) in the underlying metal interconnect line may be detected by the AC Impedance Spectroscopy measurement, as discussed in reference to FIGS. 11A through 11D, below.

Figure 8:
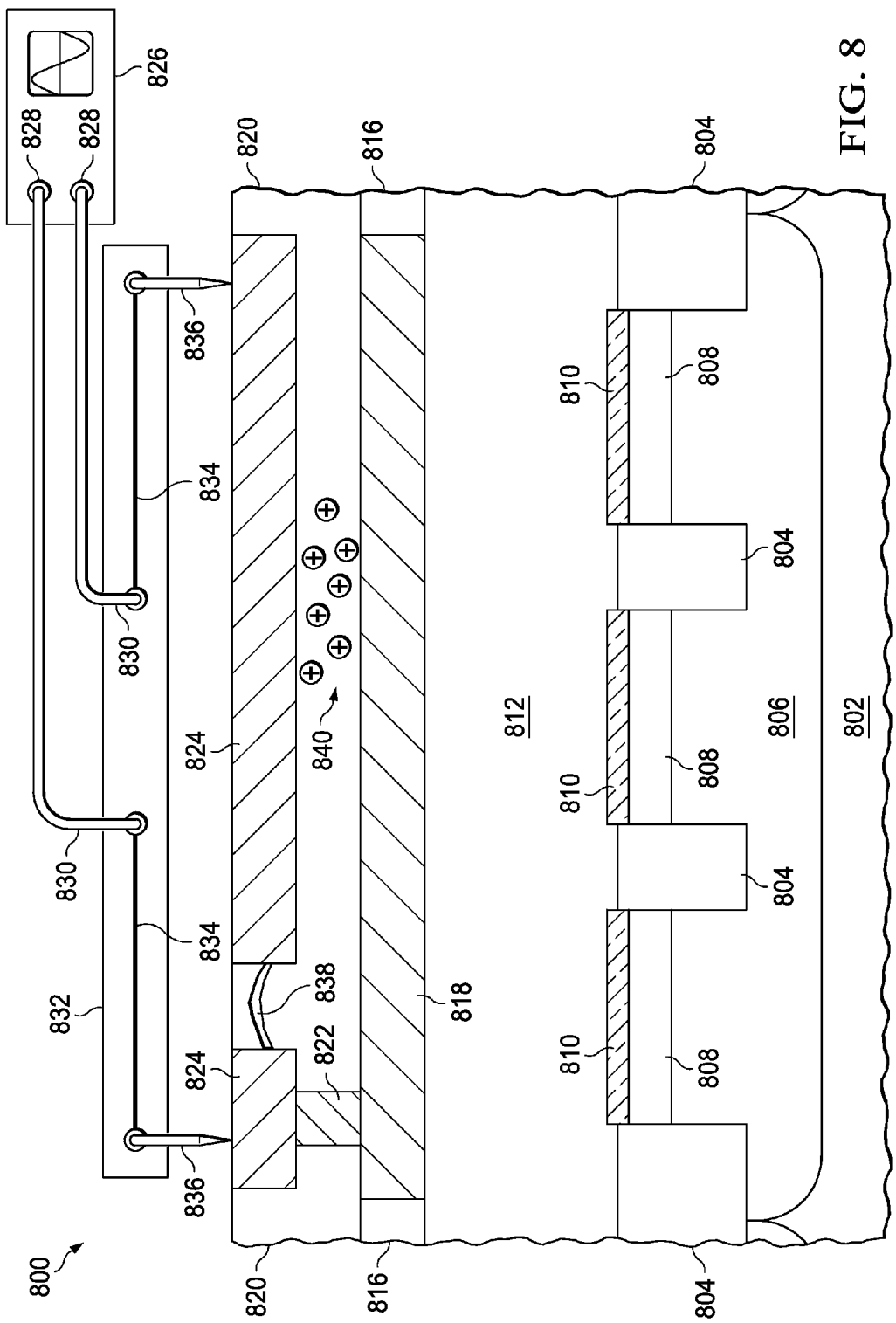
FIG. 8 depicts an IC, shown in cross-section, with a metal isolation test circuit, in an AC Impedance Spectroscopy measurement.

FIG. 8 depicts an IC, shown in cross-section, with a metal isolation test circuit, in an AC Impedance Spectroscopy measurement. IC (800) includes a substrate (802), typically p-type silicon. Regions of field oxide (804), typically silicon dioxide formed by LOCOS or STI, are formed in the substrate (802) and extend to a top surface of the substrate (802). An n-well (806) is formed, typically by ion implantation of phosphorus, in the substrate (802) and extends to the top surface of the substrate (802). Active areas (808) are ion implanted, typically with more phosphorus, with doses ranging from $10^{14}$ to $10^{16}$ cm$^{-2}$. An optional layer of silicide (810) is formed on a top surface of each active area (808). A pre-metal dielectric layer stack (PMD) (812), typically including a thin layer of silicon nitride and a thicker layer of silicon dioxide, is formed over the field oxide regions (804) and the active areas (808). A first intra-level dielectric layer (816), typically including a low-k dielectric material layer, is formed over the PMD (812). A first set of metal interconnect lines, including a first line (818) of a metal isolation test circuit are formed in first intra-level dielectric layer (816). A first inter-level dielectric layer (820), typically including a low-k dielectric material layer, is formed over the first intra-level dielectric layer (816) and the first set of metal interconnect lines. A first set of vias (822) and a second set of metal interconnect lines including a second line (824) of the metal isolation test circuit are formed in first inter-level dielectric layer (820). The first line (818), the first set of vias (822), and the second line (824) circuit are configured to form a metal isolation test circuit in which a voltage applied across two leads of the metal isolation test circuit will apply the voltage across the dielectric material separating the metal lines. The metal isolation test circuit is configured to minimize the effect of a defect in the first line (818), the first set of vias (822) or the second line (824) on an Impedance Spectroscopy measurement. An AC Impedance Analyzer (826) has output ports (828) that are connected by cables (830) to probing equipment (832). Internal connections (834) contained in the probing equipment (832) connect the cables (830) to probes (836), which are contacting test pads in the second set of metal interconnect lines (824), thereby enabling an AC Impedance Spectroscopy measurement. Metal isolation defects such as a metal filament (838) between two metal lines or a region of mobile ions (840) in the dielectric material (820) between two metal lines (818, 824) may be detected by the AC Impedance Spectroscopy measurement, as discussed in reference to FIGS. 11A through 11D, below.

Figure 9:
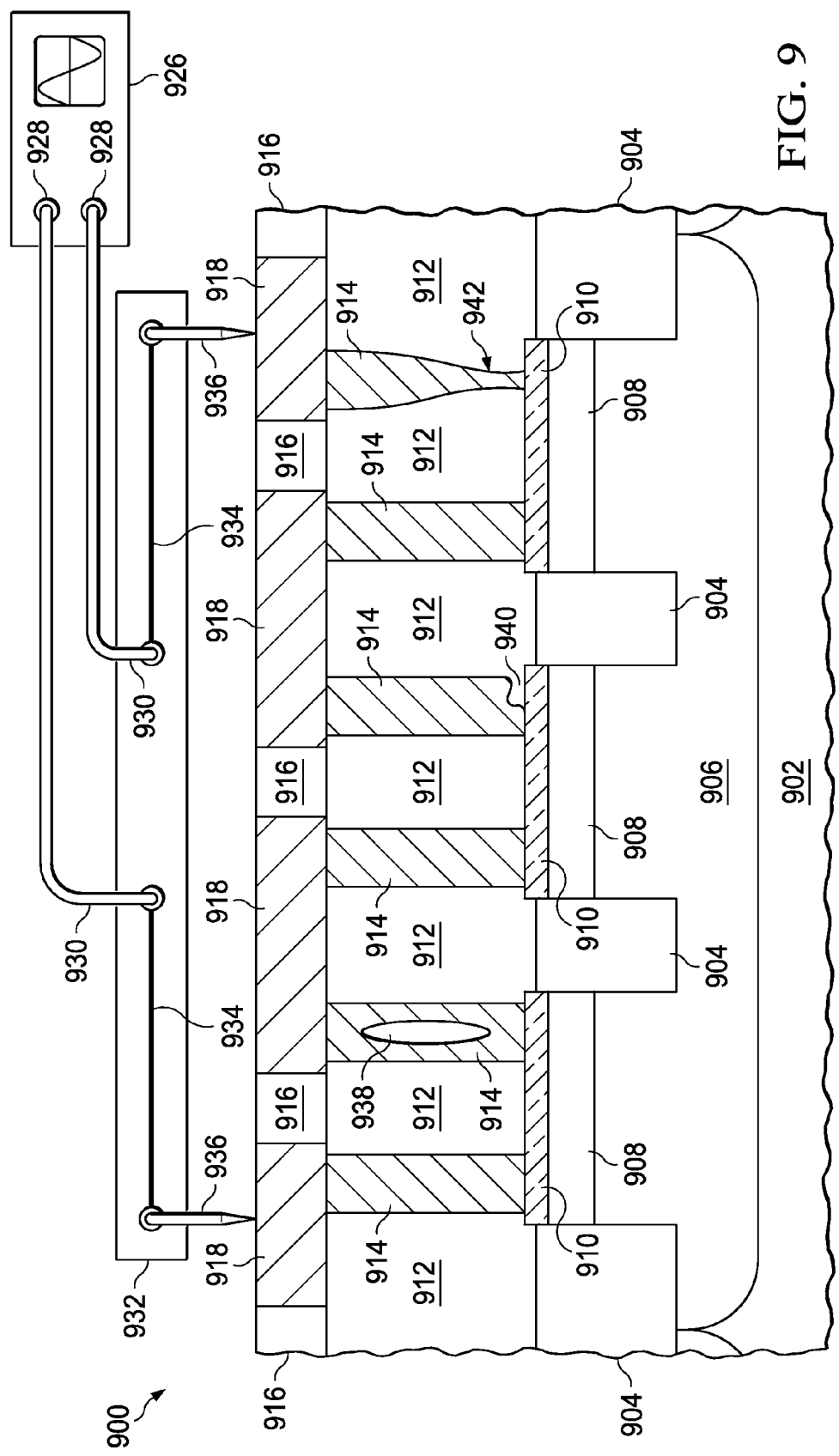
FIG. 9 depicts an IC partway through fabrication, shown in cross-section, with a contact chain test circuit, in an AC Impedance Spectroscopy measurement.

FIG. 9 depicts an IC which is partially fabricated, shown in cross-section, with a contact chain test circuit, in an AC Impedance Spectroscopy measurement. IC (900) includes a substrate (902), typically p-type silicon. Regions of field oxide (904), typically silicon dioxide formed by LOCOS or STI, are formed in the substrate (902) and extend to a top surface of the substrate (902). An n-well (906) is formed, typically by ion implantation of phosphorus, in the substrate (902) and extends to the top surface of the substrate (902). Active areas (908) are ion implanted with more phosphorus, with doses ranging from $10^{14}$ to $10^{16}$ cm$^{-2}$. An optional layer of silicide (910) is formed on a top surface of each active area (908). A pre-metal dielectric layer stack (PMD) (912), typically including a thin layer of silicon nitride and a thicker layer of silicon dioxide, is formed over the field oxide regions (904) and the active areas (908). Contacts (914) are formed in the PMD (912) and connect to the active areas (908). A first intra-level dielectric layer (916), typically including a low-k dielectric material layer, is formed over the PMD (912) and contacts (914). A first set of metal interconnect lines (918) are formed in first intra-level dielectric layer (916). The active areas (908), contacts (914) and first set of metal interconnect lines (918) are configured to form a contact continuity test chain in which an electrical current passed through the contact continuity test chain will pass through each contact. At this point in the fabrication of the IC (900), testing of the contact continuity test chain is performed. An AC Impedance Analyzer (926) has output ports (928) that are connected by cables (930) to probing equipment (932). Internal connections (934) contained in the probing equipment (932) connect the cables (930) to probes (936), which are contacting test pads in the first set of metal interconnect lines (918), thereby enabling an AC Impedance Spectroscopy measurement. Contact defects such as a void (938), a region of contamination (940) between a contact and the underlying active region or a constriction (942) may be detected by the AC Impedance Spectroscopy measurement, as discussed in reference to FIGS. 11A through 11D, below. Practitioners of IC fabrication will recognize the advantage of identifying various types of contact defects during a fabrication process, because problem-solving cycle time is reduced compared to testing after fabrication is completed.

Figure 10:
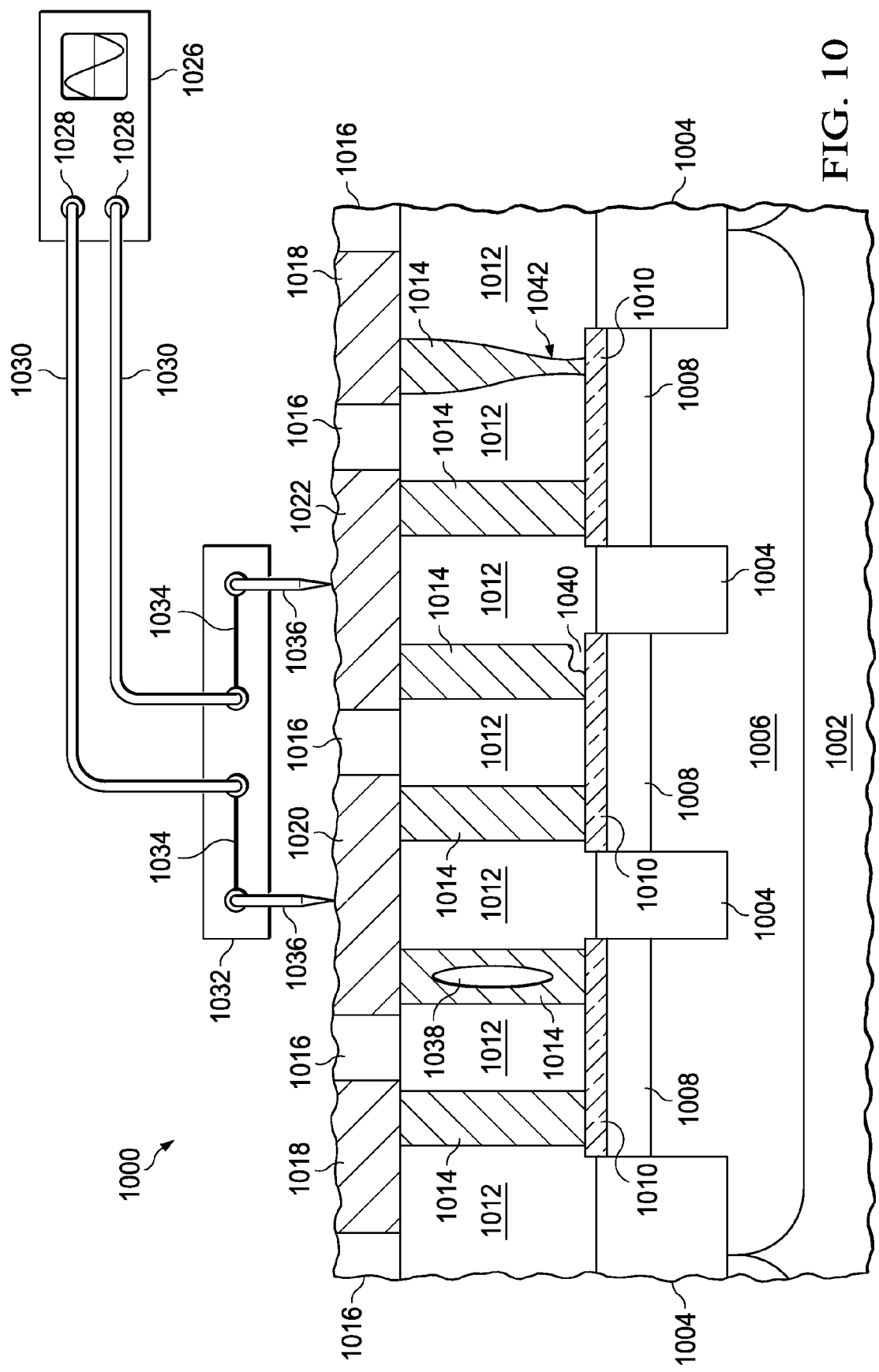
FIG. 10 depicts an IC partially deprocessed, shown in cross-section, with a contact chain test circuit, in an AC Impedance Spectroscopy measurement.

FIG. 10 depicts an IC partially deprocessed, shown in cross-section, with a contact chain test circuit, in an AC Impedance Spectroscopy measurement. IC (1000) includes a substrate (1002), typically p-type silicon. Regions of field oxide (1004), typically silicon dioxide formed by LOCOS or STI, are formed in the substrate (1002) and extend to a top surface of the substrate (1002). An n-well (1006) is formed, typically by ion implantation of phosphorus, in the substrate (1002) and extends to the top surface of the substrate (1002). Active areas (1008) are ion implanted with more phosphorus, with doses ranging from $10^{14}$ to $10^{16}$ cm$^{-2}$. An optional layer of silicide (1010) is formed on a top surface of each active area (1008). A pre-metal dielectric layer stack (PMD) (1012), typically including a thin layer of silicon nitride and a thicker layer of silicon dioxide, is formed over the field oxide regions (1004) and the active areas (1008). Contacts (1014) are formed in the PMD (1012) and connect to the active areas (1008). A first intra-level dielectric layer (1016), typically including a low-k dielectric material layer, is formed over the PMD (1012) and contacts (1014). A first set of metal interconnect lines (1018) are formed in first intra-level dielectric layer (1016). The active areas (1008), contacts (1014) and first set of metal interconnect lines (1018, 1020, 1022) are configured to form a contact continuity test chain in which an electrical current passed through the contact continuity test chain will pass through each contact. The IC (1000), has been partially deprocessed by removing all layers and elements of the IC (1000) over the first set of metal interconnect lines (1018) so that testing of the contact continuity test chain can be performed. An AC Impedance Analyzer (1026) has output ports (1028) that are connected by cables (1030) to probing equipment (1032). Internal connections (1034) contained in the probing equipment (1032) connect the cables (1030) to probes (1036), which are contacting pads (1020, 1022) in the first set of metal interconnect lines which are specific for a single contact, thereby enabling an AC Impedance Spectroscopy measurement of that single contact. Contact defects such as a void (1038), a region of contamination (1040) between a contact and the underlying active region or a constriction (1042) may be identified by the AC Impedance Spectroscopy measurement, as discussed in reference to FIGS. 11A through 11D, below. Practitioners of IC fabrication will recognize the advantage of identifying various types of contact defects in a completed IC which has been deprocessed, because problem-solving cycle time associated with isolating defective components is reduced compared to commonly used methods such as random binary searches.

Figure 11A:
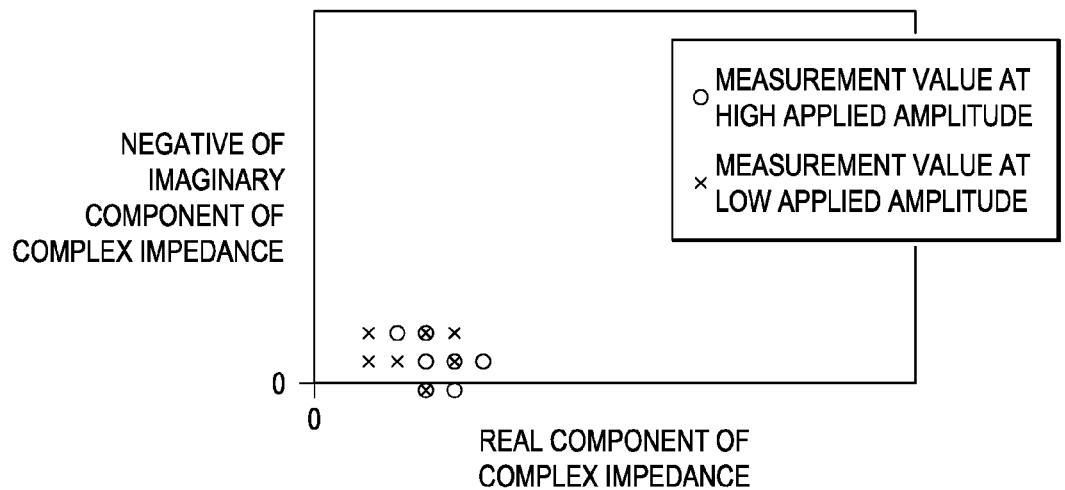
FIG. 11A, FIG. 11B, FIG. 11C and FIG. 11D are Nyquist charts for different types of defects depicting typical data values from AC Impedance Spectroscopy according to an embodiment of the instant invention.
Figure 11B:
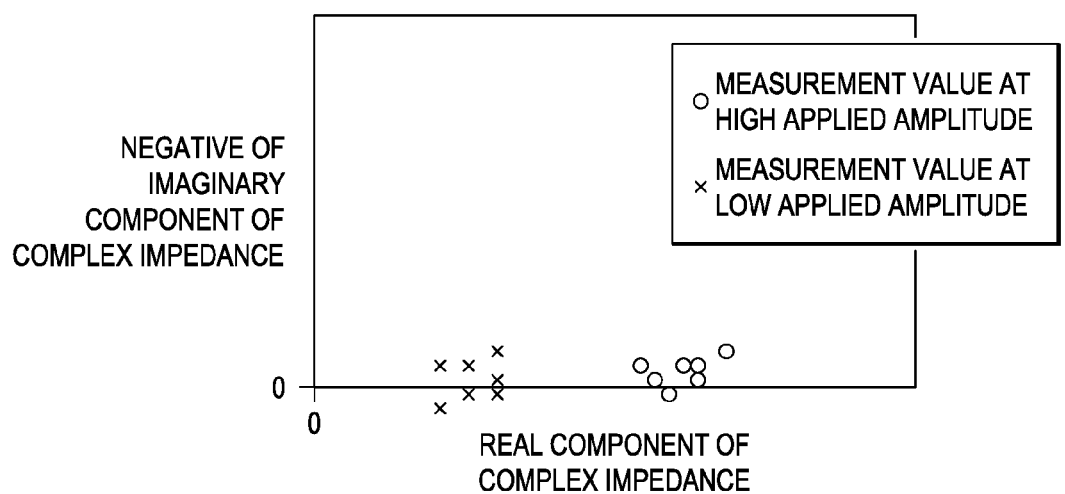
Figure 11C:
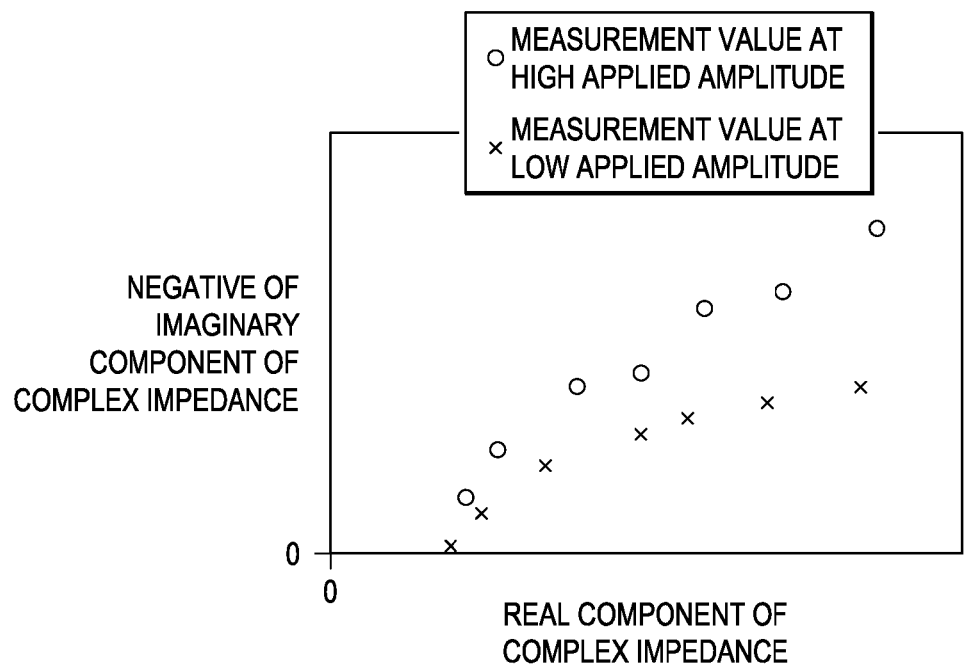
Figure 11D:
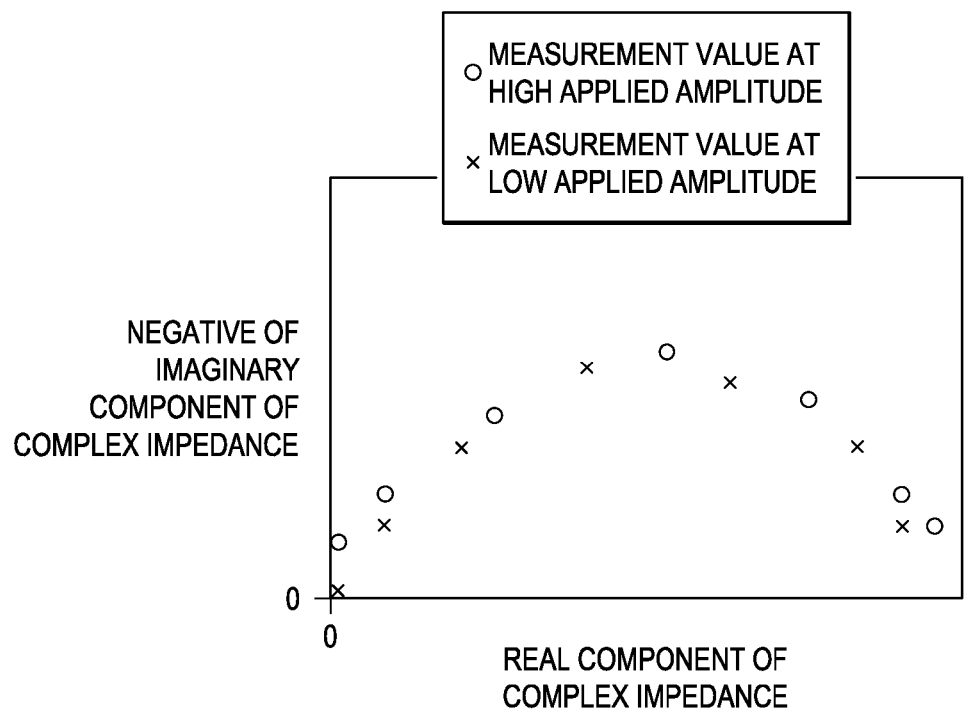

FIG. 11A, FIG. 11B, FIG. 11C and FIG. 11D are Nyquist charts for different types of defects depicting typical data values from AC Impedance Spectroscopy according to an embodiment of the instant invention. Referring to FIG. 11A, a Nyquist chart is depicted with data from a measurement of a stable short circuit defect. This type of defect is typified by a low imaginary part of the complex impedance, and small difference between high and low applied signal. Some constriction defects exhibit the type of AC Impedance Spectroscopy measurement data depicted in FIG. 11A. Referring to FIG. 11B, a Nyquist chart is depicted with data from a measurement of an unstable short circuit defect. This type of defect is typified by a low imaginary part of the complex impedance, and a real part of the complex impedance that is significantly higher at high applied signal than at low applied signal. Metal filaments between metal interconnects, voids in contacts and vias and metal silicide filaments on gate sidewall spacers exhibit the type of AC Impedance Spectroscopy measurement data depicted in FIG. 11B. Referring to FIG. 11C, a Nyquist chart is depicted with data from a measurement of a defect with mobile ions. This type of defect is typified by high real and imaginary parts of the complex impedance at low frequency of applied signal, and decreasing real and imaginary parts of the complex impedance as the frequency is increased. This type of impedance is known as a Warburg impedance. Defects with mobile ions in dielectric materials between metal interconnect lines exhibit Warburg impedances as depicted in FIG. 11C. Referring to FIG. 11D, a Nyquist chart is depicted with data from a measurement of a defect with a non-conductive region. This type of defect is typified by a high real part of the complex impedance at low frequency of applied signal, and decreasing real part of the complex impedance as the frequency is increased, with a low imaginary part of the complex impedance at low and high frequencies, but a high imaginary part of the complex impedance at intermediate frequencies, due to a capacitive behavior of the non-conducting region. Contacts and vias with contamination defects may exhibit AC impedances as depicted in FIG. 11D.

It is within the scope of this invention to apply the method of AC Impedance Spectroscopy to other components than those discussed above, including, but not limited to, diodes, bipolar transistors, thyristors, resistors, and inductors.

It is within the scope of the instant invention to apply AC Impedance Spectroscopy to a test circuit in a semiconductor wafer as well as to a component in an IC.

It is within the scope of the instant invention to apply AC Impedance Spectroscopy during fabrication of an IC as well as to apply this technique after fabrication is completed.

It is within the scope of the instant invention to apply AC Impedance Spectroscopy to an intact component or IC as well as to a partially or completely deprocessed component or IC.

It is within the scope of the instant invention to analyze the data from AC Impedance Spectroscopy measurements using Bode plots. Bode plots consist of a chart of magnitude and phase of a complex impedance as a function of a frequency of an applied signal.

What is claimed is:

1. A method of electronic testing, comprising the steps of:
providing an electronic component in an integrated circuit;
applying a sinusoidal voltage signal to said electronic component at a non-zero frequency and measuring in-phase and out-of-phase current components of said component;
varying the frequency of the applied signal in discrete steps from less than 10 Hz to above 100 MHz while repeating the measurement of the in-phase and out-of-phase current components of said electronic component at each frequency;
varying the amplitude of the applied signal in discrete steps while repeating the above step of varying the frequency of the applied signal while repeating the measurement of the in-phase and out-of-phase current components of said electronic component at each frequency and amplitude;
computing an in-phase impedance for each said in-phase current component value;
computing an out-of-phase impedance for each said out-of-phase current component value; and
analyzing said in-phase impedance values and said out-of-phase impedance values using a Nyquist plot, in which said in-phase impedance values are plotted on an x-axis of an x-y chart and said out-of-phase impedance values are plotted on a y-axis of an x-y chart.

2. The method of claim 1, in which:
said in-phase impedance is computed using the expression $V_{amplitude}/I_{in\text{-}phase\_max}$ in which $V_{amplitude}$ is an amplitude of said sinusoidal voltage signal and $I_{in\text{-}phase\_max}$ is an amplitude of said in-phase current component; and
said out-of-phase impedance is computed using the expression $V_{amplitude}/I_{out\text{-}of\text{-}phase\_max}$ in which $V_{amplitude}$ is an amplitude of said sinusoidal voltage signal and $I_{out\text{-}of\text{-}phase\_max}$ is an amplitude of said out-of-phase current component.

3. The method of claim 2, wherein said component is a contact continuity chain test circuit.

4. The method of claim 2, wherein said component is a via continuity chain test circuit.

5. The method of claim 2, wherein said component is an MOS gate dielectric integrity test circuit.

6. The method of claim 2, wherein said component is a metal line continuity test circuit.

7. The method of claim 2, wherein said component is a metal isolation test circuit comprised of metal interconnect lines which are separated by a dielectric material.

8. The method of claim 2, wherein said electronic component is tested during fabrication of said integrated circuit.

9. The method of claim 2, wherein said integrated circuit is partially deprocessed.

10. A method of fabricating an integrated circuit, comprising the steps of:
- providing a substrate;
- forming field oxide in said substrate;
- forming an n-well in said substrate;
- forming a p-well in said substrate;
- forming an n-channel MOS transistor in said p-well by a process comprising the steps of:
  - forming a first gate dielectric on a top surface of said p-well;
  - forming a first gate structure on a top surface of said first gate dielectric;
  - forming n-type source and drain regions in said p-well adjacent to said first gate structure; and
  - forming a first set of silicide regions on, and in contact with, top surfaces of said n-type source and drain regions;
- forming a p-channel MOS transistor in said n-well by a process comprising the steps of:
  - forming a second gate dielectric on a top surface of said n-well;
  - forming a second gate structure on a top surface of said second gate dielectric;
  - forming p-type source and drain regions in said n-well adjacent to said second gate structure; and
  - forming a second set of silicide regions on, and in contact with, top surfaces of said p-type source and drain regions;
- forming a pre-metal dielectric layer stack on said n-channel transistor and said p-channel transistor;
- forming contacts in said pre-metal dielectric layer stack on, and electrically connected to, said n-well, said p-well, said n-type source and drain regions and said p-type source and drain regions;
- forming a first intra-metal dielectric layer on said pre-metal dielectric layer stack;
- forming a first set of metal interconnect structures in said first intra-metal dielectric layer;
- forming a first inter-level dielectric layer on said first set of metal interconnect structures;
- forming metal vias in said first inter-level dielectric layer, whereby the metal vias contact said first set of metal interconnect structures;
- forming a second set of metal interconnect structures in said first inter-level dielectric layer, whereby the second set of metal interconnect structures contact and overlap said metal vias; and
- testing a component in said integrated circuit, comprising the steps of;
  - applying a sinusoidal voltage signal to said component at a non-zero frequency and measuring in-phase and out-of-phase current components of said component;
  - varying the frequency of the applied signal in discrete steps from less than 10 Hz to above 100 MHz while repeating the measurement of the in-phase and out-of-phase current components of said electronic component at each frequency;
  - varying the amplitude of the applied signal in discrete steps while repeating the above step of varying the frequency of the applied signal while repeating the measurement of the in-phase and out-of-phase current components of said electronic component at each frequency and amplitude;
  - computing an in-phase impedance for each said in-phase current component value;
  - computing an out-of-phase impedance for each said out-of-phase current component value; and
  - analyzing said in-phase impedance values and said out-of-phase impedance values using a Nyquist plot, in which said in-phase impedance values are plotted on an x-axis of an x-y chart and said out-of-phase impedance values are plotted on a y-axis of an x-y chart.

11. The method of claim 10, in which:
said in-phase impedance is computed using the expression $V_{amplitude}/I_{in\text{-}phase\_max}$ in which $V_{amplitude}$ is an amplitude of said sinusoidal voltage signal and $I_{in\text{-}phase\_max}$ is an amplitude of said in-phase current component; and
said out-of-phase impedance is computed using the expression $V_{amplitude}/I_{out\text{-}of\text{-}phase\_max}$ in which $V_{amplitude}$ is an amplitude of said sinusoidal voltage signal and $I_{out\text{-}of\text{-}phase\_max}$ is an amplitude of said out-of-phase current component.

12. The method of claim 11, wherein said component is a contact continuity chain test circuit.

13. The method of claim 11, wherein said component is a via continuity chain test circuit.

14. The method of claim 11, wherein said component is an MOS gate dielectric integrity test circuit.

15. The method of claim 11, wherein said component is a metal line continuity test circuit.

16. The method of claim 11, wherein said component is a metal isolation test circuit comprised of metal interconnect lines which are separated by a dielectric material.

17. The method of claim 11, wherein said electronic component is tested during fabrication of said integrated circuit.

18. The method of claim 11, wherein said integrated circuit is partially deprocessed.

* * * * *